(12) United States Patent
Mardi

(10) Patent No.: US 12,048,083 B2
(45) Date of Patent: Jul. 23, 2024

(54) MICRO DEVICE WITH ADAPTABLE THERMAL MANAGEMENT DEVICE

(71) Applicant: XILINX, INC., San Jose, CA (US)

(72) Inventor: Mohsen H. Mardi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 182 days.

(21) Appl. No.: 17/457,595

(22) Filed: Dec. 3, 2021

(65) Prior Publication Data

US 2023/0180379 A1 Jun. 8, 2023

(51) Int. Cl.
*H05K 1/02* (2006.01)
(52) U.S. Cl.
CPC ................... *H05K 1/0203* (2013.01)
(58) Field of Classification Search
CPC .......... H05K 1/00; H05K 1/0203; H05K 7/20; H01L 23/49816; H01L 25/0657; H01R 12/7076; H01R 12/714; H01R 13/2421; H01R 13/6599; H01R 24/40; G01R 1/0408; G01R 1/0483; G01R 31/02; G01R 31/045; G01R 31/20; G01R 31/2853; G01R 31/2889; G01R 31/2891
See application file for complete search history.

(56) References Cited

U.S. PATENT DOCUMENTS

| | | | | |
|---|---|---|---|---|
| 5,834,062 A | * | 11/1998 | Johnson | B05C 11/1034 427/256 |
| 6,139,079 A | * | 10/2000 | Patel | H01L 21/4846 118/213 |
| 6,397,460 B1 | * | 6/2002 | Hembree | H01R 13/2421 29/831 |
| 6,492,824 B1 | * | 12/2002 | Gesch | G01R 1/0483 439/620.2 |
| 10,367,279 B2 | | 7/2019 | Mardi | |
| 10,539,610 B2 | | 1/2020 | Mardi et al. | |
| 10,564,212 B2 | | 2/2020 | Mardi et al. | |
| 10,571,517 B1 | | 2/2020 | Mardi et al. | |
| 10,613,137 B2 | | 4/2020 | Mardi et al. | |
| 10,838,018 B1 | | 11/2020 | Mahoney et al. | |
| 11,043,484 B1 | | 6/2021 | Shi et al. | |
| 2004/0140821 A1 | * | 7/2004 | Lee | G01R 1/07314 324/754.14 |
| 2009/0085593 A1 | * | 4/2009 | Yoshida | G01R 1/06772 324/754.1 |
| 2010/0216321 A1 | * | 8/2010 | Fedde | H01R 13/2421 439/81 |
| 2015/0285840 A1 | * | 10/2015 | Matsui | G01R 1/07314 324/754.14 |
| 2015/0327394 A1 | * | 11/2015 | Davis | H01L 23/3677 361/720 |

(Continued)

*Primary Examiner* — Amir A Jalali

(74) *Attorney, Agent, or Firm* — Patterson + Sheridan, LLP

(57) ABSTRACT

Micro devices having enhanced through heat transfer utilizing plungers extending from a heat spreader are provided. In one example, a micro device is provided that includes a plunger retaining block, a plurality of plungers, a mounting substrate and an integrated circuit (IC) die. The plunger retaining block includes a top surface and a bottom surface. The plurality of plungers extend from the bottom surface of the plunger retaining block with at least some of the plurality of plungers contacting the IC die. The IC die is disposed between the plunger retaining block and the mounting substrate, and coupled to the mounting substrate.

20 Claims, 6 Drawing Sheets

(56) References Cited

U.S. PATENT DOCUMENTS

2018/0275167 A1\* 9/2018 Nagata ............... H01R 12/7005
2018/0284187 A1\* 10/2018 Refai-Ahmed .... G01R 31/2889
2019/0128956 A1\* 5/2019 Mardi .................... G01R 31/69
2020/0350716 A1\* 11/2020 Narumi ................ H01R 12/718

\* cited by examiner

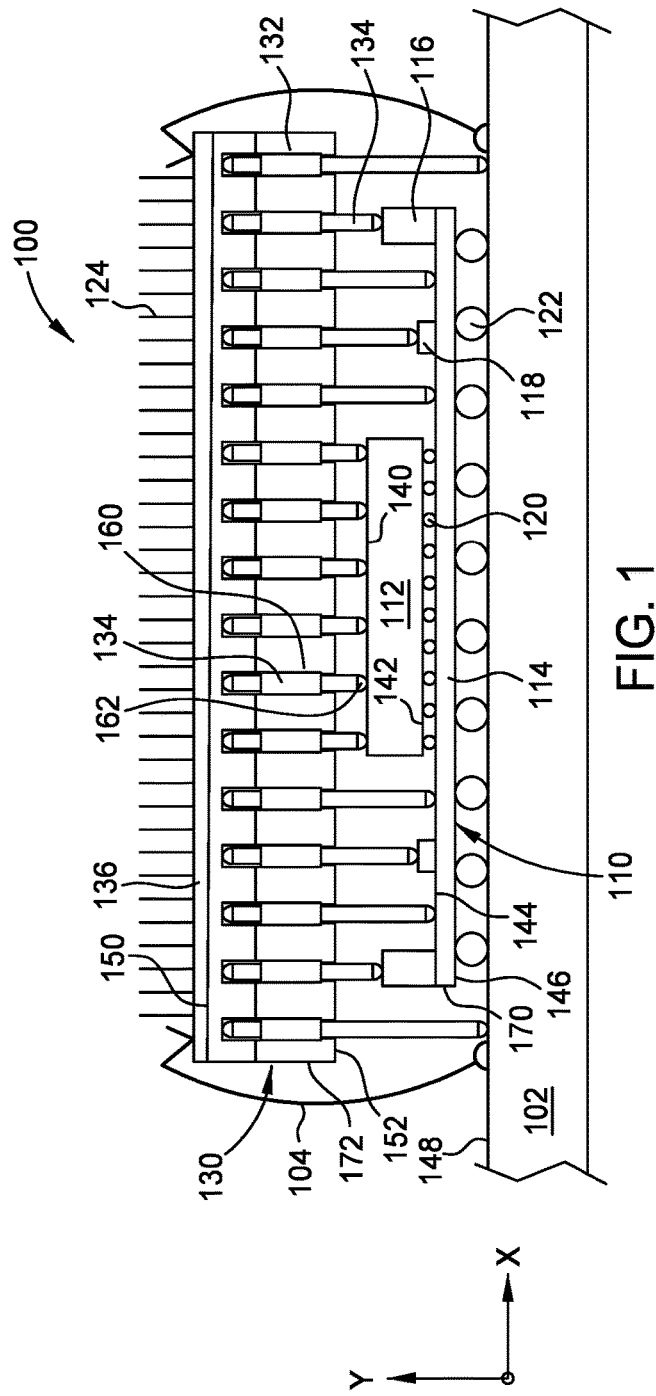
FIG. 1
FIG. 1A
FIG. 1B

MICRO DEVICE WITH ADAPTABLE THERMAL MANAGEMENT DEVICE

TECHNICAL FIELD

Embodiments of the present invention generally relate to micro devices, such as electronic devices, photonic devices, microelectromechanical systems (MEMS) and/or RF devices, integrated with a thermal management device having a plurality of plungers providing multiple cooling paths from components of the micro device that may be located at different distances from the thermal management device.

BACKGROUND

Micro devices, such as electronic devices having integrated circuit (IC) dies, photonic devices, microelectromechanical systems (MEMS) and/or RF devices, often employ electronic components which leverage chip package assemblies for increased functionality and higher component density. Conventional chip packaging schemes often utilize a package substrate, often in conjunction with a through-silicon-via (TSV) interposer, to enable a one or more of IC dies to be mounted to a single package substrate. The IC dies may include memory, logic or other IC devices. These micro devices containing one or more chip packages are frequently utilized in advanced electronic computing systems, such as found in telecomm and datacomm equipment, cellular antennas, data centers and automotive electronics, among others.

In many chip package assemblies, providing adequate thermal management has become increasingly challenging. Failure to provide adequate cooling often results in diminished service life and even device failure. Thermal management is particularly problematic in applications where active components have high current and power usage, and correspondingly generate high heat loads. Moreover, since the topography of the IC dies, surface mounted circuit elements and other features of a chip package vary chip package to chip package, thermal management devices, such as heat spreaders, heat sinks, package covers and the like, must be uniquely designed for each and every new chip package design. This need for unique custom designs for each thermal management device undesirably adds development costs and time.

Therefore, a need exists for micro devices having more flexible thermal management solutions.

SUMMARY

Micro devices, such as electronic devices, photonic devices, microelectromechanical systems (MEMS) and/or RF devices, having a plungers that provide conductive heat paths that adapted to varying topography are provided. In one example, a micro device is provided that includes a plunger retaining block, a plurality of plungers, a mounting substrate and an integrated circuit (IC) die. The plunger retaining block includes a top surface and a bottom surface. The plurality of plungers extend from the bottom surface of the plunger retaining block with at least some of the plurality of plungers contacting the IC die. The IC die is disposed between the plunger retaining block and the mounting substrate, and coupled to the mounting substrate.

In another example, another micro device is provided that includes a printed circuit board (PCB), a heat spreader, a chip package, an active and/or passive heat transfer enhancing element. The heat spreader is coupled to the PCB. A plurality of spring biased plungers extend from a bottom surface of the heat spreader. The chip package is mounted to the PCB below the heat spreader. At least some of the plurality of spring biased plungers extend from heat spreader and contact the chip package. the heat transfer enhancing element is coupled to a top surface of the heat spreader.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic sectional view of a micro device having a chip package interfaced with a heat spreader having a plurality of plungers configured to contact components of the chip package.

FIG. 1A is a schematic partial sectional view of the micro device illustrating an alternative technique for securing the heat spreader to a printed circuit board (PCB).

FIG. 1B is a schematic partial sectional view of an edge of a heat spreader illustrating an integral skirt as an alternative to a chip package mounted stiffener.

Figure 1C:
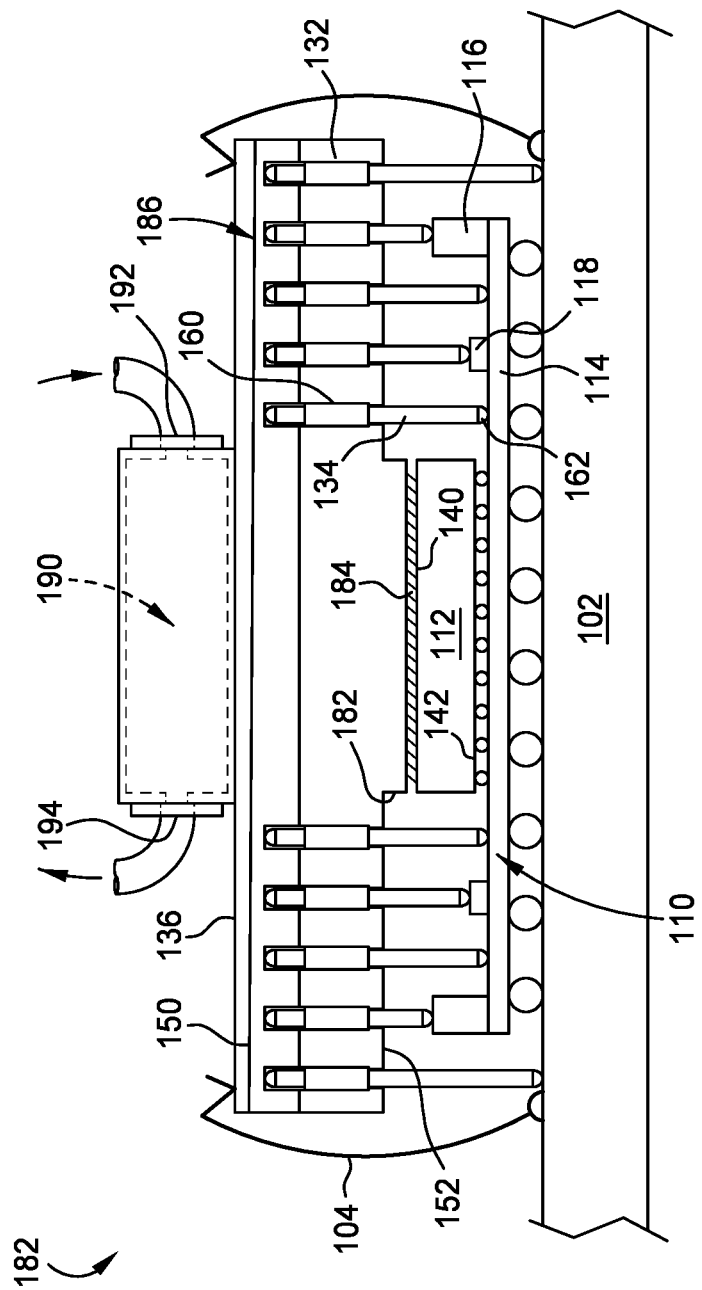
FIG. 1C is a schematic sectional view of another example of a micro device having a chip package interfaced with a heat spreader utilizing a plurality of plungers.

To facilitate understanding, identical reference numerals have been used, where possible, to designate identical elements that are common to the figures. It is contemplated that elements of one embodiment may be beneficially incorporated in other embodiments. Additionally, the adjectives top and bottom are provided for ease of explanation, and may be utilized to desired surfaces that alternatively may have a vertical orientation.

DETAILED DESCRIPTION

Micro devices having enhanced heat transfer are provided. The enhanced heat transfer is provided by a plurality of plungers that extend from a bottom surface of a thermal management device (e.g., a heat spreader) that enable efficient heat transfer from irregular surface topography of chip packages interfaced with the thermal management device of the micro device. Example of micro devices include, without limitation, electronic devices having integrated circuit (IC) dies, photonic devices, microelectromechanical systems (MEMS) and/or RF devices. The micro devices described herein utilize a thermal management device in the form of a heat spreader having plurality of plungers that function as heat conductors that provide linear, extendable, thermally conductive heat transfer paths between regions of a chip package having different elevations. The ability of the plungers to move, conform and interface with the different elevations across the topography of a chip package enables one the heat spreader to be utilized with many different chip packages, saving significant design and development time and costs. Moreover, the use of plungers allows for more forgiving tolerances, further reducing the cost of the heat spreader. Another advantage is the modularity of the heat spreader enables different active and/or passive heat transfer elements, i.e., heat transfer fins, heat pipe, refrigerant, heat transfer fluid, a vapor, air, and liquid metal, among others, to be interchangeably mounted to a plunger retaining block of the heat spreader, further allowing additional design flexibility for accommodating different thermal budgets without the need to wholly redesign another custom thermal management device. Thus, the heat spreader provides a plurality of efficient vertically confirming conductive heat transfer paths from irregular topographies to the heat spreader without interfering with the design or performance of the chip package, which enables higher power usage and improved performance of the micro device.

Turning now to FIG. 1, a schematic partial sectional view of a micro device 100 having at least one chip package 110 mounted to a printed circuit board (PCB) 102. The micro device 100 additionally includes a heat spreader 130 interfaced with the chip package 110. The heat spreader 130 functions as the primary package-level thermal management device of the chip package 110. In embodiments where a single or multiple heat spreaders 130 is interfaced with more than one the chip package 110, the heat spreader 130 functions as the primary global-level thermal management device of the the micro device 100. As such, the plane area of the heat spreader 130 is generally larger than that of the underlying chip package 110. For example as depicted in FIG. 1, an edge 172 of the heat spreader 130 extends beyond the extents of an edge 170 of the underlying chip package 110.

The heat spreader 130 is retained to one or both of the chip package 110 and the PCB 102. In the example depicted in FIG. 1, the heat spreader 130 coupled to the PCB 102 by one or more retaining devices 104. The retaining devices 104 may be spring clips (as shown in FIG. 1), clamps, fasteners or other suitable device. In an example depicted in FIG. 1A, the retaining device 104 is illustrated as a fastener 106 that engages a threaded hole disposed in or on the heat spreader 130. A spring 108 is disposed between the head of the fastener 106 and the PCB 102 to pull the heat spreader 130 towards the PCB 102, thus providing good thermal contact between the heat spreader 130 and the chip package 110.

Continuing to refer to FIG. 1, the chip package 110 is mechanically and electrically connect to a top surface 148 of the PCB 102 by solder balls 122. Alternatively, the chip package 110 may be mounted on the top surface 148 of the PCB 102 via other techniques or devices, for example by use of a socket. Although only one chip package 110 is shown mounted to the PCB 102 in FIG. 1, more than one chip package 110 may be mounted to the PCB 102. For example, up to as many chip packages 100 as can fit on the PCB 102 may be utilized. Additionally, although only one PCB 102 is shown interfaced with a single heat spreader 130 in FIG. 1, more than one PCB 102 may be interfaced with the heat spreader 130. For example, up to as many PCBs 102 as available area allows to interface with the heat spreader 130 may be utilized.

The chip package 110 may be a monolithic package, a Chip-on-Wafer-on-Substrate (CoWoS) package, a multi-chip module, an Embedded Multi-die Interconnect Bridge (EMIB) high density package, an Integrated Fan-Out (InFO) wafer level package, or other suitable chip package configuration. The chip package 110 may be configured as a silicon device, a MEMS device, a photonic device, or an RF device. The chip package 110 may optionally comprise two or more types of the aforementioned devices. For example, the chip package 110 may include one or more silicon devices and one or more MEMS devices, and optionally one or more photonic devices and/or one or more RF devices. In another example, the chip package 110 may include one or more silicon devices and one or more photonic devices, and optionally one or more MEMS devices and/or one or more RF devices. In another example, the chip package 110 may include one or more silicon devices and one or more RF device devices, and optionally one or more MEMS devices and/or one or more photonic devices. In yet another example, the chip package 110 may include one or more MEMS devices and one or more photonic devices, and optionally one or more silicon devices and/or one or more RF devices. In still another example, the chip package 110 may include one or more MEMS devices, one or more RF devices, and optionally one or more silicon devices and/or one or more photonic devices.

The illustrative chip package 110 also includes one or more integrated circuit (IC) dies 112 and a mounting substrate, shown in FIG. 1 as package substrate 114. The chip package 110 may optionally a stiffener 116. The stiffener 116 generally is fabricated from a rigid material and is mounted to a top surface 144 of the package substrate 114. The stiffener 116 is utilized to inhibit warpage of the package substrate 114. The chip package 110 may also optionally one or more surface mounted circuit elements 118. The surface mounted circuit elements 118 are also coupled to the top surface 144 of the package substrate 114 in a region defined the stiffener 116 and the IC die 112. The surface mounted circuit elements 118 may be one or more of a capacitor, diode, resistor, inductor, or other suitable discrete circuit element. The surface mounted circuit elements 118 are soldered to a conductor residing on or in the package substrate 114, and are coupled to the circuitry of the IC dies 112 through the circuitry of the package substrate 114. As illustrated in FIG. 1, the IC die 112, the surface mounted circuit elements 118 and stiffener 116 all project to different elevations relative to the top surface 144 of the package substrate 114.

The IC die 112 is electrically and mechanically mounted to the package substrate 114, for example using solder interconnects 120. Optionally, the IC die 112 may be electrically and mechanically mounted to an intermediary mounting substrate, such as an interposer, with the interposer electrically and mechanically mounted to the package substrate 114. The package substrate 114 of the chip package 110 is mounted to the PCB 102 to form at least a portion of the micro device 100.

Although a single IC die 112 is shown in FIG. 1, the total number of IC dies comprising the chip package 110 may range from one to as many as can be fit within the chip package 110. In examples having multiple IC dies 112, the dies 112 may be stacked vertically in a direction perpendicular to the orientation of the package substrate 114, and/or laterally spaced apart in a horizontal plane (i.e., parallel to the orientation of the package substrate 114). The vertical and horizontal directions are illustrated using X and Y coordinates in FIG. 1 for convenience of description, but it is contemplated that the orientation of the micro device 100 may be rotated to have an orientation different than as shown in FIG. 1.

Examples of IC dies 112 that may be utilized in the chip package 110 include, but are not limited to, logic and memory devices, such as field programmable gate arrays (FPGA), application-specific integrated circuits (ASICs), memory devices, such as high band-width memory (HBM), optical devices, processors or other IC logic or memory structures. One or more of the IC dies 112 may optionally include optical devices such as photo-detectors, lasers, optical sources, and the like.

The IC die 112 includes a top surface 140 disposed opposite a bottom surface 142. The top and bottom surfaces 140, 142 do not necessarily represent the active and substrate sides of the die 112. Although not shown, one or more IC dies 112 maybe stacked on top of each other, with the bottom most die 112 being mounted to a top surface 144 of the package substrate 114. In the example depicted in FIG. 1, the bottom surface 142 of the IC die 112 is disposed on the top surface 144 of the package substrate 114, and a bottom surface 146 of the of the package substrate 114 is disposed on a top surface 150 of the PCB 102.

Functional circuitry of the IC die 112 is connected to the circuitry of the package substrate 114 through the solder interconnects 120 or other suitable electrical connection, such as a hybrid connecter comprised of metal circuit connection material disposed in a dielectric sheet. In the example depicted in FIG. 1, a bottom surface 146 of the package substrate 114 is electrically and mechanically coupled to the circuitry of the PCB 102 via solder balls 122 when the chip package 110 is mounted to the top surface 148 of the PCB 102 to form the micro device 100.

The top surface 140 of the upper most die 112 (when more than one IC die are present) faces a bottom surface 152 of the heat spreader 130. Optionally, a top surface 150 of the heat spreader 130 facing away from the chip package 110 may be interfaced with an optional heat transfer enhancing element 136.

The heat spreader 130 provides an efficient heat transfer path to sink heat away from the IC die 112 of the chip package 110. Particularly, the heat spreader 130 is configured to dynamically adapted to uneven topographical surfaces of the chip package 110 through a plurality of separate extendable conductive heat transfer paths, enabling higher powered IC dies 112 and other devices to be conductively connected to the heat spreader 130 for more robust performance with enhanced reliability in the micro device 100. The separate extendable conductive heat transfer paths enable a single heat sink design to be utilized with a wide number of different chip packages without having to custom design a new heat sink for each chip package, thus saving significant design costs and time.

The heat spreader 130 includes a plunger retaining block 132 that retains a plurality of plungers 134 that extend out from a bottom surface 152 of the heat spreader 130. The plungers 134 provide the plurality of separate extendable conductive heat transfer paths that enable the heat spreader 130 to adapt to varying topography. An optional heat transfer enhancing element 136 may be coupled to or integrated with a top surface 150 of the plunger retaining block 132. The heat transfer enhancing element 136 may be a passive or active heat transfer device. Examples of active heat transfer devices include fans, thermoelectric (i.e., Peltier) cooler, forced air or fluid heat exchangers, and the like. Examples of passive heat transfer devices include heat pipes, fins, copper plates, and the like. In the example depicted in FIG. 1, the heat transfer enhancing element 136 is illustrated as a plurality of fins 124.

The plunger retaining block 132 is fabricated from a rigid thermally conductive material, such as stainless steel, copper, nickel-plated copper and aluminum, among other suitable thermally conductive materials. In some embodiments, the bottom surface 152 may include a downward projecting skirt 156 (as shown in FIG. 1B). The skirt 156 is dispose at or adjacent the edge 172 of the plunger retaining block 132. The skirt 156 extends a distance from the plunger retaining block 132 about equal to or slightly greater than a distance that the top surface 140 of the IC die 112 extends about the top surface 144 of the package substrate 114 such that the skirt 156 may function as, or take the place of the stiffener 116.

Continuing to refer to FIG. 1, the plunger retaining block 132 also includes a plurality of holes 160 formed in the bottom surface 152 through which the plungers 134 extend. The plungers 134 are fabricated from a rigid thermally conductive material, such as stainless steel, copper, nickel-plated copper and aluminum, among other suitable thermally conductive materials. The plungers 134 are configured to provide efficient heat transfer from the plunger 134 to the plunger retaining block 132. In one example, a thermal grease or similar heat transfer enhancing material may be disposed between the plunger 134 and the plunger retaining block 132 to promote heat transfer therebetween.

Each plunger 134 is independently movable relative to all of the other plungers 134 so that distal ends 162 of the plungers 134 may be contact with the different components (stiffener 116, surface mounted circuit elements 118, IC die 112, package substrate 114) of the chip package 110 that extend to different elevations above the top surface 144 of the package substrate 114. In some examples, the plungers 134 have enough travel relative to the plunger retaining block 132 to even contact the top surface 148 of the PCB 102, thus enabling the heat spreader to allow heat transfer from the PCB 102 and components mounted thereon to the heat spreader 130. Each plunger 134 is biased to extend away from the bottom surface 152 of the heat spreader 130 with a force of about a few kilograms, in one example.

As the heat spreader 130 is disposed directly above the chip package 110, the plungers 134 are in good thermal contact directly with the top surface 140 of the IC die 112 and the other components of the chip package 110 facing the heat spreader 130. Thus, the plungers 134 not only provides an efficient heat transfer path to heat spreader 130 away from the IC die 112, but from also the other components of the chip package 110. Thus, the heat spreader 130 accepts both heat from the IC die 112 and, for example, heat from the surface mounted circuit elements 118 of the chip package 110 through separate conductive heat transfer paths, enabling higher powered IC dies 112 and other devices to be used in the micro device 100 for more robust performance with enhanced reliability.

In some embodiments, the heat spreader 130 may utilize the plungers 134 to contact the irregular height features of the components of the chip package 110 other than the IC die 112. For example, in the cross sectional schematic view of a micro device 180 illustrated in FIG. 1C, a heat spreader 186 is shown illustrated interfaced with a chip package 110 of the micro device 180. The heat spreader 186 is essentially the same as the heat spreader 130 described above, except that a bottom surface 152 of the heat spreader 186 includes a projecting contact pad 182 that is devoid of plunders 134. The contact pad 182 is sized to contact the top surface 140 of the IC die 112. A thermal interface material (TIM) 184, such as a thermal grease or similar heat transfer enhancing material, may be disposed between the contact pad 182 and the top surface 140 of the IC die 112 to promote heat transfer therebetween.

Although the heat spreader 186 maybe configured with either active or passive heat transfer enhancing elements, in the example depicted in FIG. 1C, the heat spreader 186 is configured as an active heat transfer enhancing element 136. The active heat transfer enhancing element 136 includes an internal cavity 190 having an inlet 192 and an outlet 194. A heat transfer fluid, such as air, a refrigerant, water, oil or there flowable heat transfer medium, is pumped or pulled through the internal cavity 190 between the inlet 192 and the outlet 194 to remove heat from the heat spreader 186, and thus from the chip package 110 positioned below and in conductive contact with the heat spreader 186. It is also contemplated that an active heat transfer enhancing element 136 may be utilized to heat the chip package 110 rather than be utilized as a heat sink. For example, the active heat transfer enhancing element 136 may be a resistive heater or have a hot fluid circulated therethrough such that heat is transferred to the heat spreader 186, and thus to the chip package 110 positioned below and in conductive contact with the heat spreader 186.

Figure 2:
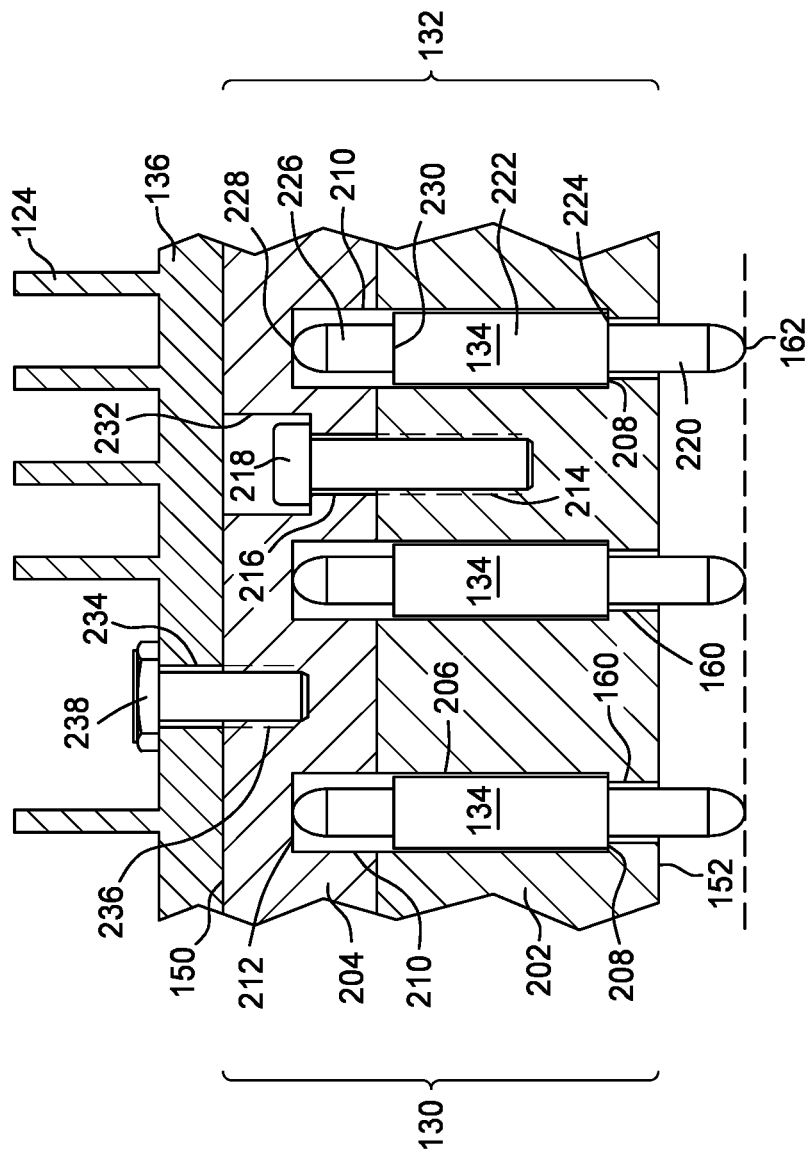
FIG. 2 is a schematic partial sectional view of the heat spreader of FIG. 1 illustrating a plunger retaining block having plungers extending from a bottom surface thereof.

FIG. 2 is a partial enlarged sectional view of the heat spreader 130 illustrating one configuration of the plunger retaining block 132. It is contemplated that the plunger retaining block 132 may be constructed to retain the plungers 134 utilizing other configurations. In the example of FIG. 2, the plunger retaining block 132 includes a base 202 and a cap 204. Materials suitable for fabricating the base 202 and the cap 204 include stainless steel, copper, nickel-plated copper and aluminum, among other suitable thermally conductive materials. In the example depicted in FIG. 2, the base 202 and the cap 204 are fabricated from aluminum.

The base 202 and the cap 204 can be secured together utilizing a number of different techniques, for example by soldering, adhering, brazing, clamping, fastening or otherwise affixing the base 202 in good thermal contact with the cap 204. In one example, the base 202 and the cap 204 are secured together in a manner that captures the plungers 134 extending out of the bottom surface 152 of the heat spreader 130, which is also the bottom surface 152 of the plunger retaining block 132. The base 202 and the cap 204 may be secured together utilizing a number of different techniques. In one example, the cap 204 includes a clearance hole 216 that aligns with a threaded hole 214. A fastener 218 extends through the clearance hole 216 and engages the threaded hole 214 to secure the base 202 and cap 204 together. The cap 204 may include a counterbore 232 to accommodate the head of the fastener 218.

Similarly, the heat transfer enhancing element 136 may be secured to the plunger retaining block 132 utilizing a number of different techniques, for example by soldering, adhering, brazing, clamping, fastening or otherwise affixing the heat transfer enhancing element 136 in good thermal contact with the top surface 150 of the plunger retaining block 132. In one example, the cap 204 of the plunger retaining block 132 includes a threaded hole 236 that aligns with a clearance hole 234 formed through the heat transfer enhancing element 136. A fastener 238 extends through the clearance hole 234 and engages the threaded hole 234 to secure the heat transfer enhancing element 136 to the plunger retaining block 132.

As discussed above, the plungers 134 are retained in a manner such that a piston 220 of the plunger 134 extends out the holes 160 of the plunger retaining block 132. Each hole 160 formed in the base 202 of the plunger retaining block 132 includes a counterbore 206. A ledge 208 formed by the change in diameter where the counterbore 206 ends at the hole 160 prevents the body 222 of the plunger 134 from passing through the hole 160. Stated differently, the end 224 of the body 222 has a diameter less than a diameter of the counterbore 206, but greater than a diameter of the hole 160 so that the body 222 of the of the plunger 134 is retained in the counterbore 206 while the piston 220 is free to pass through and move freely within the hole 160.

The counterbore 206 in the base 202 is covered by the cap 204, thus retaining the plungers 134 within the plunger retaining block 132. In some examples, an end 230 of the body 222 that is opposite the end 224 abuts or is closely spaced with the cap 204. In other example, the counterbore 206 in the base 202 is aligned with a blind hole 210 formed in the cap 204. The end 230 of the body 222 may abut the bottom 212 of the blind hole 210. Alternatively as illustrated in FIG. 2, a stud 226 may extend from the body 222 of the plunger 134 and abut bottom 212 of the blind hole 210. The stud 226 may be press fit, staked, swaged, crimped, pinned or otherwise fixed to the body 222. As discussed above, a thermal grease or other heat transfer enhancing material may be disposed between the plunger 134 and the base 202 and/or cap 204 to increase heat transfer therebetween.

Figure 3:
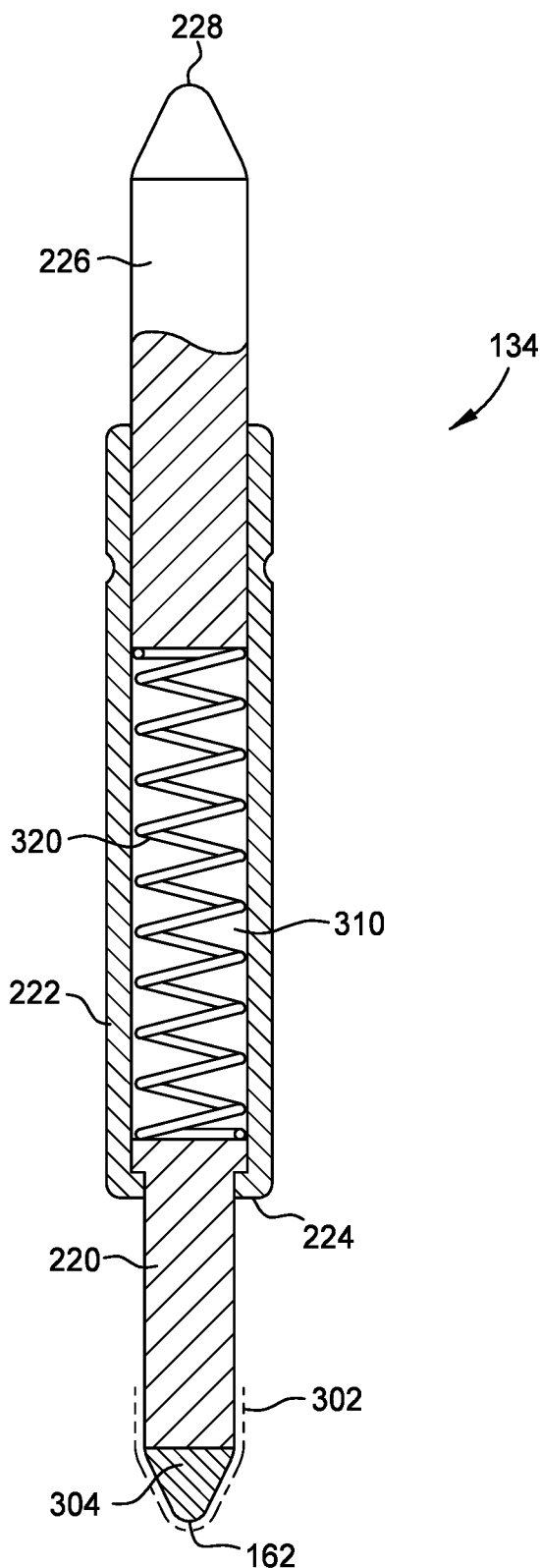
FIG. 3 is a schematic sectional view of one example of a plunger of the heat spreader of FIG. 2.

FIG. 3 is a sectional view of one example of a plunger 134. As discussed above, the plunger 134 is configured to provide an efficient heat transfer path between the distal ends 162, 228 of the plunger 134. As such, the components of the plunger 134, such as the piston 220, body 222 and stud 226 (when present), are fabricated from materials having good thermal conductivity, such as metals or other materials with similar coefficients of heat transfer.

In some examples, the rate of heat transfer across all of the plungers 134 may varied so that more heat may be transmitted though one plunger 134 relative to another plunger 134 within the plunger retaining block 132. For example, one plunger 134 may be fabricated from a material having a larger coefficient of heat transfer relative to another plunger 134. For example, one plunger 134 may have a very low coefficient of heat transfer relative to another plunger 134 having a high coefficient of heat transfer. In another example, one plunger 134 may be fabricated with a geometry that more efficiently conducts heat relative to another plunger 134. For example, one plunger 134 may have thick sidewalls relative to another plunger 134 having thin sidewalls.

Generally, the plunger 134 in addition to being thermally conductive, is also electrically conductive between the distal ends 162, 228. However, in some embodiments where it is undesirable for the plunger 134 to provide an electrical path between the distal end 162 the plunger 134 and other portion of the plunger retaining block 132, the plunger 134 may include a dielectric material portion configured to prevent current from passing from the ends 162 or along other portions of the plunger 134 to the plunger retaining block 132. In one example, the end 162 of the piston 220 that contacts the chip package 110 or PCB 102 may be fabricated from a dielectric material 304. In another example, the end 162 of the piston 220 that contacts the chip package 110 or PCB 102 may be coated with a dielectric material 302.

As discussed above, the piston 220 is biased to extend away from the body 222 of the plunger 134. To provide the bias force, a spring 320 is disposed in a hollow cavity 310 of the body 222. The spring 320 abuts the stud 226 (or enclosed end of the body 222) at one end, and abuts the end of the piston 220 at the other end. The spring constant may be different in different plungers 134 such that in regions anticipating large displacements of the piston 220, such as over the IC die 112, exert less force than other areas, such as over surface mounted circuit elements 118, where little displacement of the piston 220 is experienced once the heat spreader 130 is secured in contact with the chip package 110.

Aggregate and local forces exerted on the chip package 110 by the pistons 220 of the plungers 134 may be controlled utilizing techniques in addition or in alternative to having different springs with in different plungers. For example, the depth of the blind holes 210 in the caps 204 may be varied to control the displacement of the piston 220, and hence, the compression force generated by the spring 320. In another example the spacing between pistons 220 may be varied to control the local and aggregate force applied to different regions of the chip package 110.

FIGS. 4A-4D are exemplary geometric arrangements of plungers 134 extending from the bottom surface 152 of the heat spreader 130. It is contemplated that other geometric arrangements of plungers 134 may be utilized, including utilized two or more geometric arrangements of FIGS. 4B, 4C and/or 4D.

Figure 4B:
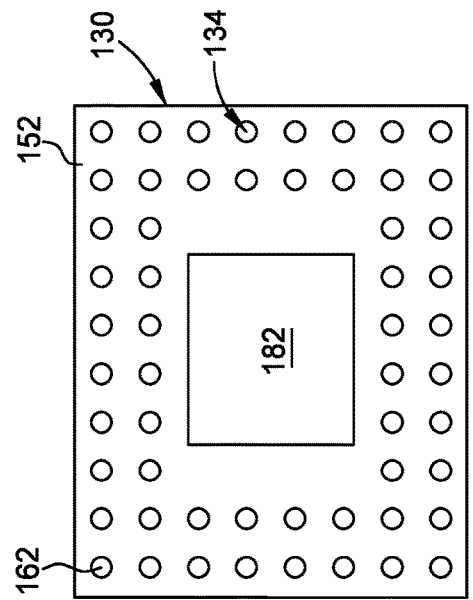
FIGS. 4A-4D are schematic bottom views of heat spreaders illustrating exemplary geometric arrangements of the plungers extending from the bottom surface of the heat spreaders.
Figure 4A:
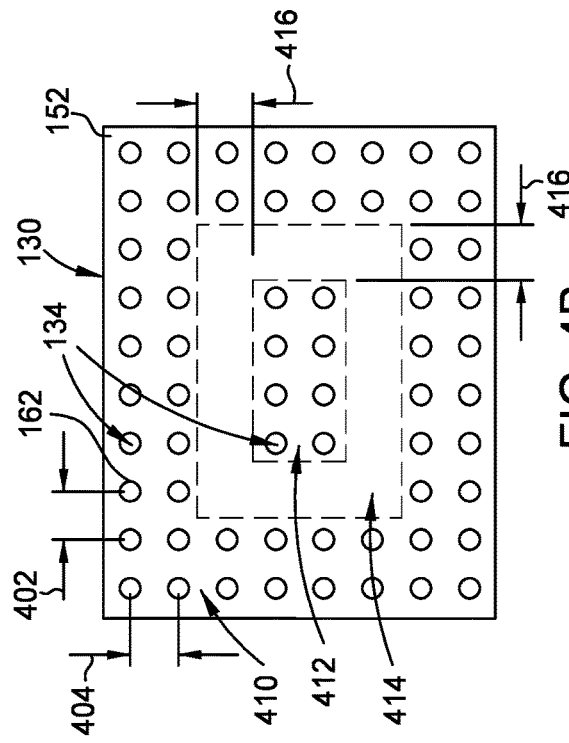

Referring first to the example of FIG. 4A, the plungers 134 extending from the bottom surface 152 of the heat spreader 130 are generally distributed in a uniform arrangement. In one example, the density of the plungers 134 is essentially uniform across the bottom surface 152 of the heat spreader 130. In another example, a pitch 402 between centers of adjacent plungers 134 in a first direction may be the same, more or less than a pitch 404 between centers of adjacent plungers 134 in a second direction. In FIG. 4A, the pitches 402, 404 of the plungers 134 across the bottom surface 152 of the heat spreader 130 are the same. Optionally, at least one of more of the plungers 134 depicted in FIG. 4A may have a coefficient of heat transfer that is different than one or more of the other plungers 134 spanning the bottom surface 152 of the heat spreader 130 so that the profile of the rate of heat transfer may be tailored as desired.

In the example of FIG. 4B, the plungers 134 are missing from a portion of the bottom surface 152 of the heat spreader 130 designated as a depopulated region 414. Thus, in the depopulated region 414, there are no plungers 134 extending from the bottom surface 152 of the heat spreader 130. The depopulated region 414 has a width 416 as the distance between adjacent plungers 134 that is greater than a pitch (in the same direction as the distance is measured) of the plungers 134 adjacent the depopulated region 414.

In the example of FIG. 4B, the plungers 134 are arranged in at least two groups 410 and 412. The density of the plungers 134 comprising the first group 410 of plungers 134 may be the same, more or less than a density of the plungers 134 comprising the second group 412 of plungers 134. The groups 410, 412 are separated by the depopulated region 414.

The depopulated region 414 may be aligned with components of the chip package 110 and/or PCB 102 that contact with a plunger 134 would be undesirable. For example, the depopulated region 414 may be aligned (i.e., disposed over) conductive components of the chip package 110 and/or PCB 102, such as traces, routing, solder connection, surface mounted circuit elements 118 or other elements of which electrical connection through, or force exerted by, the plunger 134 is undesired.

The number, density, pitch, size, location and shape of the groups 410, 412 of plungers 134 and the depopulated region 414 are illustrative in FIG. 4B. The actual number, density, pitch, size, location and shape of the depopulated region 414 may be selected from one of each to as many as may be arranged across the bottom surface 152 of the heat spreader 130. Likewise, the actual number, density, pitch, size, location and shape of the groups 410, 412 of plungers 134 may also vary. Optionally, at least one of more of the plungers 134 comprising one or both of the groups 410, 412 of plungers 134 depicted in FIG. 4B may have a coefficient of heat transfer that is different than one or more of the other plungers 134 within the same or different one of the groups 410, 420 spanning the bottom surface 152 of the heat spreader 130 so that the profile of the rate of heat transfer may be tailored as desired.

Figure 4D:
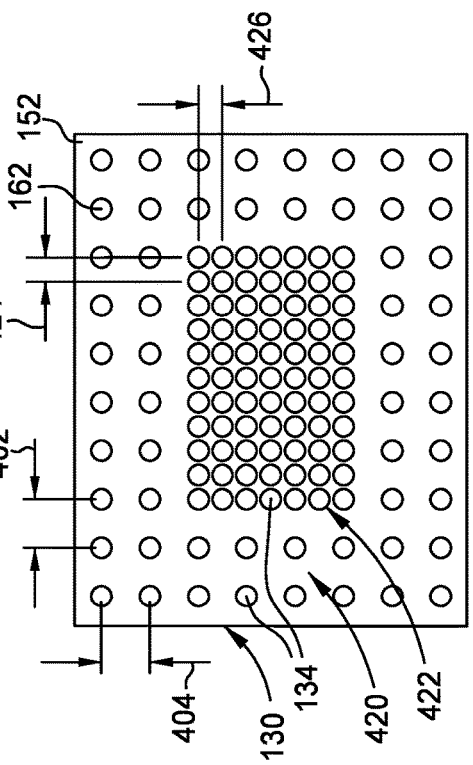
Figure 4C:
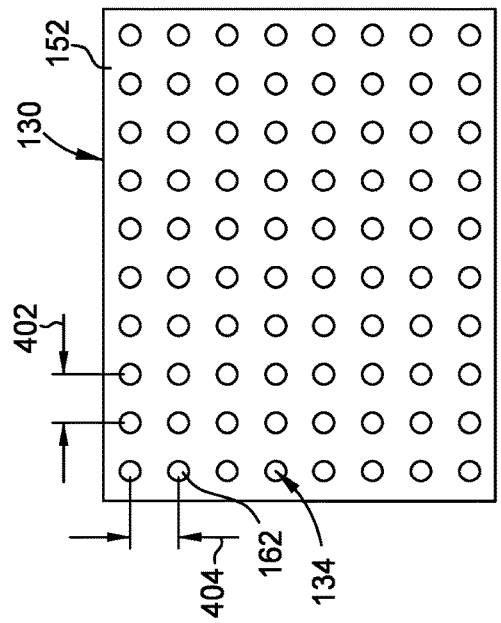

In the example of FIG. 4C, the plungers 134 are arranged in at least two groups 420 and 422. The density of the plungers 134 comprising the first group 420 of plungers 134 is different than a density of the plungers 134 comprising the second group 422 of plungers 134. Although the density of the plungers 134 comprising the first group 420 of plungers 134 is shown as being less than the density of the plungers 134 comprising the second group 422, the density of the plungers 134 comprising the first group 420 may alternatively be greater than the density of the plungers 134 comprising the second group 422. The groups 420, 422 may optionally be separated by a depopulated region 414, such as shown in FIG. 4B.

A pitch 424 between centers of adjacent plungers 134 of the second group 422 in a first direction may be the same, more or less than a pitch 426 between centers of adjacent plungers 134 of the second group 422 in a second direction. In FIG. 4C, the pitch 424, 426 of the plungers 134 of the second group 422 is uniform.

The number, density, pitch, size, location and shape of the groups 420, 422 of plungers 134 are illustrative in FIG. 4C. The actual number, density, pitch, size, location and shape of each of the groups 420, 422 of plungers 134 may be selected as desired.

In the example of FIG. 4D, the plungers 134 are located to at least one side of a contact pad 182 extending from a bottom surface 152 of the heat spreader 138 (also shown in cross section in FIG. 1C) that is configured to contact a top surface 140 of an IC die 112. In one example, the contact pad 182 is surrounded on all sides by plungers 134. The plungers 134 surrounding the contact pad 182 may be uniform in pitch and or density as shown in FIG. 4A, have one or more depopulated regions 414 as shown in FIG. 4B, have regions 420, 422 of different density as shown in FIG. 4C, or any combination thereof. Optionally, at least one of more of the plungers 134 depicted in FIG. 4D may have a coefficient of heat transfer that is different than one or more of the other plungers 134 spanning the bottom surface 152 of the heat spreader 130 so that the profile of the rate of heat transfer may be tailored as desired.

Figure 5:
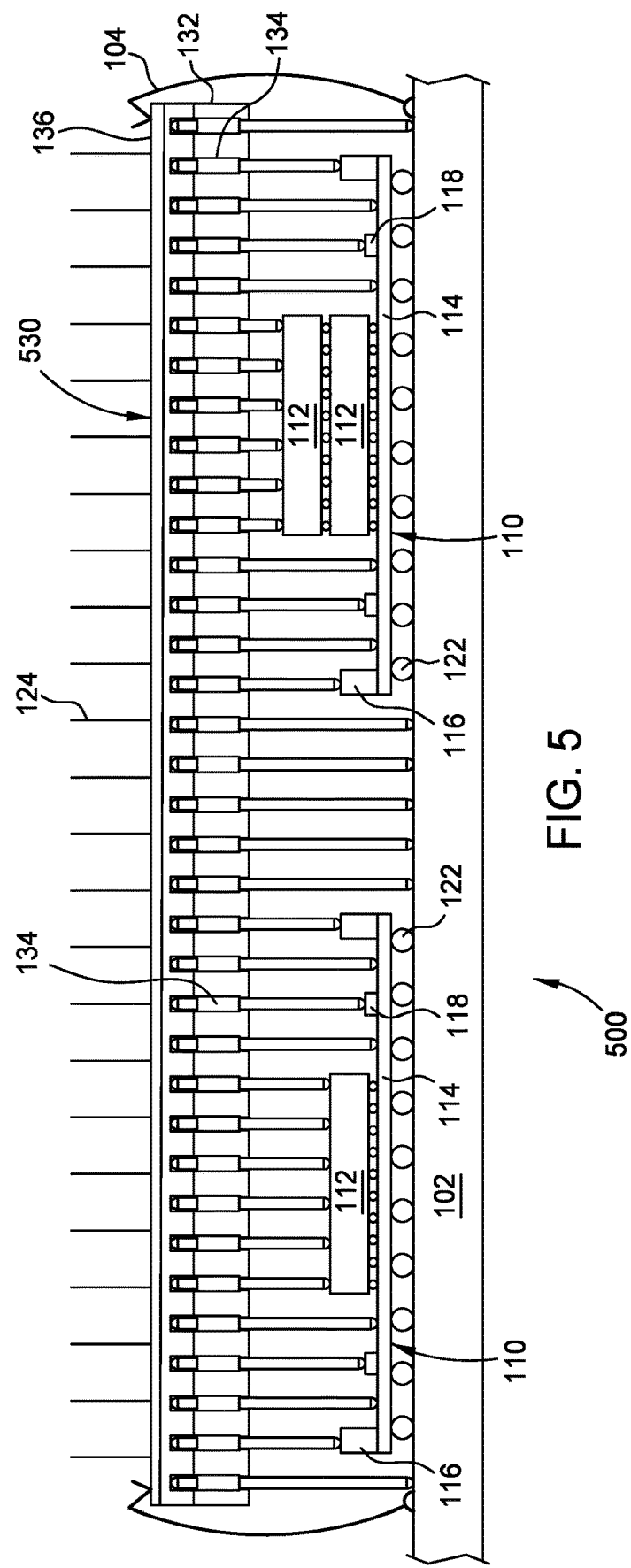
FIG. 5 is a schematic sectional view of another micro device having multiple chip packages interfaced with a single heat spreader.

FIG. 5 is a schematic sectional view of another micro device 500 having multiple chip packages 110 disposed on a common PCB 102 and interfaced with a single heat spreader 530. Each chip package 110 may be configured as described above, with one or more IC dies 112 mounted to a package substrate 114. Each chip package 110 may optionally include one or more surface mounted circuit elements 118 and/or a stiffener 116. Although two chip packages 110 are illustrated in FIG. 5, the micro device 100 may have more than two chip packages 110 interfaced with a single heat spreader 530. The chip packages 110 interfaced with the heat spreader 530 may be the same or different.

The heat spreader 530 is generally configured identical to the heat spreader 130 described above, except wherein the heat spreader 530 spaces at least two chip packages 110. The heat spreader 530 may optionally be large enough to span and be interfaced with all the chip packages 110 mounted to the PCB 102.

The heat spreader 530 is mounted to the PCB 102 with retaining devices 104 as described above. The retaining devices 104 may be spring clips (as shown in FIG. 5), clamps, fasteners or other suitable device.

The heat spreader 530 includes a plunger retaining block 132 that houses a plurality of plungers 134. Some of plungers 134 are interfaced with one of the chip packages 110, while other plungers 134 are interfaced with another one of the chip packages 110. Optionally, some of the plungers 134 may also be interfaced with the PCB 102, for example in a region of the PCB 102 disposed between two chip packages 110. In one example, the topography of the components of the chip packages 110 is different, such that a component of one of the chip packages 110 extends a greater distance from the package substrate 114 than an identical component of the other one of the chip packages 110. The ability of the pistons 220 of the plungers 134 move independently to confirm to the different topography of the chip packages 110 having various elevations from the package substrate 114 ensures good and efficient heat transfer through the plungers 134 to the heat spreader 530 from each of the chip packages 110 comprising the micro device 500.

Thus, micro devices having enhanced heat transfer from uneven topography are provided. The micro devices utilize a plurality of linearly extendable heat paths provided ay a plurality of plungers extending from a bottom surface of the heat spreader. In addition to heat removed from the IC dies of the chip package to a heat spreader, the heat spreader may also be configured to remove heat from the PCB to which the chip package is mounted. The flexibility of the heat spreader to effectively interface with different chip packages significantly reduces the time burden and cost associated with having to design and manufacture custom heat spreaders for each new chip package design. The additional efficient heat transfer provided by the plurality of heat transfer paths enable higher power usage, improved performance and improved reliability of the chip package, and ultimately better efficiency and performance of the micro devices.

While the foregoing is directed to embodiments of the present invention, other and further embodiments of the invention may be devised without departing from the basic scope thereof, and the scope thereof is determined by the claims that follow.

What is claimed is:

1. A micro device comprising:
   a plunger retaining block having a top surface and a bottom surface;
   a plurality of plungers extending from the bottom surface of the plunger retaining block;
   a mounting substrate;
   a retainer comprising a spring or a spring clip coupling the plunger retaining block with the mounting substrate; and
   one or more integrated circuit (IC) dies coupled to the mounting substrate, the one or more IC dies disposed between the plunger retaining block and the mounting substrate, at least some of the plurality of plungers contacting a first IC die of the one or more IC dies,
   wherein the plunger retaining block comprises a contacting pad extending from the bottom surface of the plunger retaining block, the contacting pad being devoid of plungers and contacting a second IC die of the one or more IC dies.

2. The micro device of claim 1, wherein the mounting substrate is a printed circuit board.

3. The micro device of claim 2, wherein the plunger retaining block is secured to the printed circuit board.

4. The micro device of claim 2, wherein the mounting substrate is a packing substrate having the one or more IC dies mechanically and electrically coupled thereto;
   wherein the plunger retaining block is secured to the printed circuit board, sandwiching the packing substrate and the one or more IC dies between the plunger retaining block and the printed circuit board; and
   wherein at least some of the plurality of plungers are contacting the first IC die and the printed circuit board, the plungers providing a conductive heat transfer path between the first IC die, the printed circuit board, and the plunger retaining block.

5. The micro device of claim 4 further comprising:
   a plurality of surface mounted circuit elements disposed in the mounting substrate, wherein a first plunger of the plurality of plungers has a distal end contacting a first surface mounted circuit element of the surface mounted circuit elements, the plungers providing a conductive heat transfer path between the first surface mounted circuit element and the plunger retaining block.

6. The micro device of claim 5, wherein the first plunger provides an open electrical circuit between a distal end of the first plunger and the plunger retaining block.

7. The micro device of claim 1, wherein at least a first plunger of the plurality of plungers provides an open electrical circuit between a distal end of the first plunger and the plunger retaining block.

8. The micro device of claim 1, wherein the plurality of plungers further comprises:
   a first group of plungers having a first center to center pitch in a first direction, at least some of the first group of plungers touching the first IC die; and
   a second group of plungers having a second center to center pitch in the first direction that is different than the first center to center pitch.

9. The micro device of claim 8, wherein the first group of plungers are separated from the second group of plungers by a distance in the first direction that is greater than the greater each of the first and second center to center pitches.

10. The micro device of claim 1, wherein the plurality of plungers further comprises:
    a first group of plungers having a first center to center pitch in a first direction, at least some of the first group of plungers touching the first IC die; and
    a second group of plungers having a second center to center pitch in the first direction, wherein the first group of plungers are separated from the second group of plungers by a distance in the first direction that is greater than at least one of the first and second center to center pitches.

11. The micro device of claim 10, wherein the distance separating the first group of plungers from the second group of plungers is greater than both of the first and second center to center pitches.

12. The micro device of claim 1, wherein the contacting pad provides a thermally conductive heat transfer path between the second IC die and the plunger retaining block.

13. The micro device of claim 12, wherein the plurality of plungers further comprises:
    a first group of plungers having a first center to center pitch in a first direction, at least a first plunger of the first group of plungers touching a chip package component selected from the group consisting of the mounting substrate, a surface mounted circuit element and a stiffener.

14. The micro device of claim 12, wherein the plurality of plungers further comprises:
a first group of plungers having a first center to center pitch in a first direction, at least a first plunger of the first group of plungers touching a chip package component selected from the group consisting of the mounting substrate and a stiffener; and
a second group of plungers having a second center to center pitch, at least one plunger of the second group of plungers contacting a surface mounted circuit element and providing a conductive heat transfer path between the surface mounted circuit element and the plunger retaining block.

15. The micro device of claim 1 further comprising:
a heat transfer enhancing element contacting the top surface of the plunger retaining block.

16. The micro device of claim 15, wherein the heat transfer enhancing element further comprises at least one heat transfer element selected from the group consisting of heat transfer fins; a heat pipe; and a body containing or configured to circulate a refrigerant, a heat transfer fluid, a vapor, air, liquid metal, or a combination of one or more elements.

17. The micro device of claim 1 further comprising:
a skirt extending from a bottom surface of the plunger retaining block, the skirt circumscribing the one or more IC dies and contacting the mounting substrate.

18. The micro device of claim 1, wherein at least some of the plurality of plungers contact at least two IC dies.

19. The micro device of claim 1, wherein the one or more IC dies coupled to the mounting substrate are part of a first chip package; and wherein the micro device further comprises:
a second chip package disposed adjacent the first chip package, the second chip package in contact with the plunger retaining block and the mounting substrate, at least some of the plurality of plungers contacting an IC die of the second chip package.

20. A micro device comprising:
a printed circuit board (PCB)
a heat spreader coupled to the PCB, the heat spreader having a plurality of spring biased plungers extending from a bottom surface of the heat spreader;
a retainer comprising a spring or a spring clip and coupling the heat spreader with the PCB;
a chip package mounted to the PCB below the heat spreader, wherein at least some of the plurality of spring biased plungers extending from the heat spreader contact a first IC die of the chip package; and
an active and/or passive heat transfer enhancing element coupled to a top surface of the heat spreader,
wherein the heat spreader comprises a contacting pad extending from the bottom surface of the heat spreader, the contacting pad being devoid of spring biased plungers and contacting a second IC die of the chip package.

* * * * *